(12) United States Patent
Zhang

(10) Patent No.: US 9,240,361 B2
(45) Date of Patent: Jan. 19, 2016

(54) ARRAY SUBSTRATE, METHOD FOR FABRICATING AND TESTING ARRAY SUBSTRATE, AND DISPLAY DEVICE

(71) Applicant: BOE Technology Group Co., Ltd., Beijing (CN)

(72) Inventor: Mi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/081,562

(22) Filed: Nov. 15, 2013

(65) Prior Publication Data
US 2014/0138685 A1    May 22, 2014

(30) Foreign Application Priority Data
Nov. 20, 2012    (CN) .......................... 2012 1 0473102

(51) Int. Cl.
| | |
|---|---|
| *H01L 23/58* | (2006.01) |
| *H01L 21/66* | (2006.01) |
| *H01L 27/12* | (2006.01) |
| *H01L 51/05* | (2006.01) |
| *H01L 29/66* | (2006.01) |

(52) U.S. Cl.
CPC .............. *H01L 22/32* (2013.01); *H01L 27/124* (2013.01); *H01L 51/0545* (2013.01); *H01L 27/1251* (2013.01); *H01L 29/66757* (2013.01); *H01L 29/66765* (2013.01)

(58) Field of Classification Search
CPC ... H01L 27/1214; H01L 27/124; H01L 22/32; G02F 2001/136254
See application file for complete search history.

(56) References Cited

U.S. PATENT DOCUMENTS

| | | | |
|---|---|---|---|
| 2002/0115246 A1 | 8/2002 | Moon | |
| 2012/0138938 A1* | 6/2012 | Bae et al. | ........................ 257/59 |

FOREIGN PATENT DOCUMENTS

| | | |
|---|---|---|
| CN | 1877432 A | 12/2006 |
| CN | 101677094 A | 3/2010 |
| JP | 2007-178810 A | 7/2007 |
| KR | 2003-0094752 | * 12/2003 |

OTHER PUBLICATIONS

Office action and search report from Chinese Patent Office for priority application 201210473102.6 dated Sep. 2, 2014.

* cited by examiner

*Primary Examiner* — A. Sefer
(74) *Attorney, Agent, or Firm* — Frommer Lawrence & Haug LLP

(57) ABSTRACT

The present invention provides an array substrate, which includes a plurality of pixel units, each pixel unit includes a thin film transistor, a pixel electrode, a common electrode and a passivation layer, the thin film transistor includes an active layer, a gate electrode, a source electrode and a drain electrode, the drain electrode and the pixel electrode are connected, the passivation layer is disposed on the active layer, the source electrode, the drain electrode and the pixel electrode, the common electrode is disposed above the pixel electrode with the passivation layer therebetween, a test electrode is disposed on the active layer and under the passivation layer, the test electrode is electrically insulated from the gate electrode, the source electrode and the drain electrode. Correspondingly, a method for fabricating and a method for testing the array substrate, and a display device including the array substrate are provided.

11 Claims, 5 Drawing Sheets

ARRAY SUBSTRATE, METHOD FOR FABRICATING AND TESTING ARRAY SUBSTRATE, AND DISPLAY DEVICE

FIELD OF THE INVENTION

The present invention relates to the field of a display manufacturing technology, and particularly, to an array substrate, a display device including the array substrate, a method for fabricating the array substrate and a method for testing the array substrate.

BACKGROUND OF THE INVENTION

With the development of a display manufacturing technology, a liquid crystal display technology develops rapidly, it has replaced a traditional cathode-ray-tube display and become the mainstream of future flat panel displays. In the field of the liquid crystal display technology, Thin Film Transistor Liquid Crystal Displays (TFT-LCDs) are widely used in televisions, computers, mobile phones and other areas due to their advantages of large size, high integration, powerful functions, flexible manufacturing process and low cost. Wherein, a TFT-LCD of an Advanced Super Dimension Switch (ADS, also referred to as ADSDS) mode forms a multiple dimension electric field by an electric field generated by slit electrode edges in the same plane and an electrical field generated between slit electrode layer and plate electrode layer, in order to enable the liquid crystal molecules with all orientations between the slit electrodes in liquid crystal box and right above the electrodes to rotate, and thus the operation efficiency of the liquid crystal is improved and light transmission efficiency is increased, thereby increasing the picture quality of TFT-LCD products. Therefore, the TFT-LCD of an Advanced Super Dimension Switch mode is widely used in the liquid crystal display area.

In a TFT-LCD, a display panel is the main component thereof, and is generally formed by aligning and assembling a manufactured array substrate and a color filter substrate and then perfusing liquid crystal molecules. In an ADS mode display panel, to detect whether the TFT channel can be driven normally, a test on the TFT channel characteristics locating on the array substrate is required (generally, including tests on TFT switch current, threshold voltage and electron mobility. The specific test method is: connecting a probe of the test apparatus to a pixel electrode (the pixel electrode is located at the uppermost layer of the array substrate, and therefore the probe can be directly connected to the pixel electrode), as a drain electrode and the pixel electrode are connected, the probe of the test apparatus can be connected to the drain electrode through the pixel electrode; then inputting corresponding signals into gate lines and data lines through the probe of the test apparatus, respectively; and determining whether the TFT channel can be normally driven according to the signal obtained from the drain electrode by the test apparatus.

With the development of a TFT technology, a wide viewing angle panel capable of being visible in the sunshine, i.e., High aperture ADS (H-ADS) mode display panel, comes forth in this area. In an array substrate of an H-ADS mode display panel, as a pixel electrode is located in the middle part of the array substrate (as shown in FIG. 1, a pixel electrode 8 is located between a gate insulating layer 5 and a passivation layer 9), such that the probe of the test apparatus cannot be connected to the pixel electrode or the drain electrode (the drain electrode is also located in the middle part of the array substrate, as shown in FIG. 1, a drain electrode 7b is located between an active layer 6 and the passivation layer 9), and therefore, an existing test apparatus cannot be used to perform TFT channel characteristics test on the H-ADS mode display panel.

SUMMARY OF THE INVENTION

In view of the above problems existing in the prior art, the technical problem to be solved by the present invention is to provide an array substrate, a display device including the array substrate, a method for fabricating the array substrate and a method for testing the array substrate, in which a TFT channel characteristics test can be performed using an existing test apparatus.

The technical solutions used to solve the above technical problem are:

The array substrate includes a plurality of pixel units, each pixel unit includes a thin film transistor, a pixel electrode, a common electrode and a passivation layer, the thin film transistor includes an active layer, a gate electrode, a source electrode and a drain electrode, the drain electrode and the pixel electrode are connected, the passivation layer covers the active layer, the source electrode, the drain electrode and the pixel electrode, the common electrode is disposed above the pixel electrode with the passivation layer therebetween, a test electrode is further disposed on the active layer and under the passivation layer, the test electrode is electrically insulated from the gate electrode, the source electrode and the drain electrode.

Preferably, a via is provided at a position on the test electrode in the passivation layer.

Preferably, the array substrate further includes a gate insulating layer; the gate insulating layer covers the gate electrode, and the active layer is disposed on the gate insulating layer above the gate electrode, and the source electrode and the drain electrode are disposed on the active layer, respectively.

Preferably, the array substrate further includes a gate insulating layer; the gate insulating layer covers the gate electrode, the source electrode and the drain electrode are disposed on the gate insulating layer at two sides of the gate electrode, respectively, and the active layer is disposed on the gate insulating layer above the gate electrode and extends onto the source electrode and the drain electrode.

Preferably, the common electrode extends above the test electrode.

The present invention also provides a display device including the above-described array substrate.

The present invention also provides a method for manufacturing the array substrate, including steps:

1) forming a thin film transistor, a pixel electrode and a test electrode on a substrate, the thin film transistor including an active layer, a gate electrode, a source electrode and a drain electrode, the pixel electrode being connected to the drain electrode of the thin film transistor, the test electrode being formed on the active layer, and the test electrode being electrically insulated from the gate electrode, the source electrode and the drain electrode;

2) forming a passivation layer on the substrate subjected to step 1), the passivation layer covering the test electrode, the active layer, the source electrode, the drain electrode and the pixel electrode;

3) forming a common electrode on the substrate subjected to step 2), the common electrode being disposed above the pixel electrode with the passivation layer therebetween.

Preferably, the step 2) further includes a step of forming a via at a position on the test electrode in the passivation layer.

Preferably, the step 1) further includes a step of forming a gate insulating layer which includes forming the gate electrode on the substrate; forming the gate insulating layer on the gate electrode; forming the active layer on the gate insulating layer above the gate electrode; forming the source electrode and the drain electrode on the active layer, respectively.

Preferably, the step 1) further includes a step of forming a gate insulating layer which includes forming the gate electrode on the substrate; forming the gate insulating layer on the gate electrode; forming the source electrode and the drain electrode on the gate insulating layer at two sides of the gate electrode, respectively; forming the active layer on the gate insulting layer above the gate electrode, and on the source electrode and the drain electrode.

Preferably, in the step 1), forming the test electrode, the source electrode and the drain electrode in the same patterning process; the test electrode is of the same material as the source electrode and the drain electrode.

Preferably, the common electrode extends above the test electrode.

The present invention also provides a method for testing channel characteristics of the thin film transistor on the above-described array substrate, and the method includes steps:

separating the common electrode on a pixel to be detected from the common electrode on the other pixels;

in the pixel to be detected, forming a via on the test electrode in the passivation layer; and electrically connecting the common electrode with the test electrode through an electrically conductive material layer in the via.

Preferably, the electrically conductive material layer is the common electrode which has covered the test electrode with the passivation layer therebetween when manufacturing the array substrate.

Preferably, the via is formed on the test electrode in the passivation layer by means of laser fusion, and the electrically conductive material layer is melted and flows into the via.

Preferably, the electrically conductive material layer is formed by depositing electrically conductive material using a chemical vapor deposition (CVD) apparatus during testing.

In the figures: 1—substrate; 2—gate electrode; 3—gate line; 4—data lines; 5—gate insulating layer; 6—active layer; 7a—source electrode; 7b—drain electrode; 8—pixel electrode; 9—passivation layer; 10—common electrode; 11—test electrode; 12—via.

DETAILED DESCRIPTION OF EMBODIMENTS

In order to enable persons skilled in the art to better understand the technical solutions of the present invention, the array substrate, the display device including the array substrate, the method for fabricating the array substrate and the method for testing the array substrate will be described in detail with reference to the accompanying drawings and specific embodiments.

Embodiment 1:

This embodiment provides an array substrate, which includes multiple pixel units including thin film transistor (TFT), a test electrode, a pixel electrode, a common electrode and a passivation layer; the thin film transistor includes an active layer, a gate electrode, a source electrode and a drain electrode.

Wherein, the drain electrode is connected to the pixel electrode; the common electrode is disposed on the pixel electrode with the passivation layer therebetween; the test electrode is disposed between the active layer and the passivation layer, and the test electrode is electrically insulated from the gate electrode, the source electrode and the drain electrode; the passivation layer covers the active layer, the test electrode, the source electrode, the drain electrode and pixel electrode.

This embodiment also provides a display device including the above-described array substrate.

Figure 1:
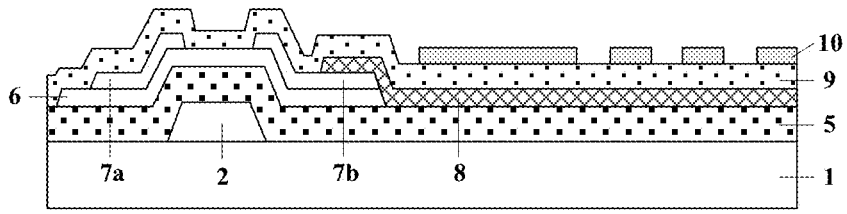
FIG. 1 is a schematic diagram of a structure of an array substrate in the existing H-ADS mode display panel.
Figure 2:
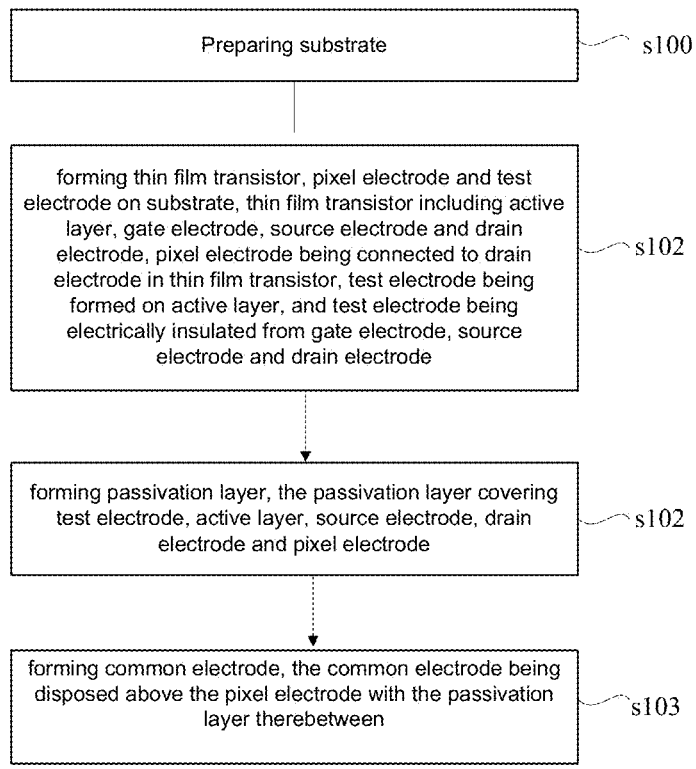
FIG. 2 is a flowchart of a method for fabricating the array substrate in embodiment 1 of the present invention.

As shown in FIG. 2, this embodiment also provides a method for fabricating the above-described array substrate, including the following steps:

S100: preparing a substrate;

S101: forming a thin film transistor, a pixel electrode and a test electrode on the substrate, the thin film transistor including an active layer, a gate electrode, a source electrode and a drain electrode, the pixel electrode being connected to the drain electrode in the thin film transistor, the test electrode being formed on the active layer, and the test electrode being electrically insulated from the gate electrode, the source electrode and the drain electrode;

S102: forming a passivation layer on the substrate subjected to step S101, and the passivation layer covering the test electrode, the active layer, the source electrode, the drain electrode and the pixel electrode;

S103: forming a common electrode on the substrate subjected to step S102, the common electrode being disposed above the pixel electrode with the passivation layer therebetween.

It should be noted that the method for fabricating the array substrate according to this embodiment does not limit the number of times of patterning process required to form the structures of respective layers. For example, the number of times of patterning process may be reduced by using a halftone mask plate or a gray tone mask plate, or the like.

Figure 3:
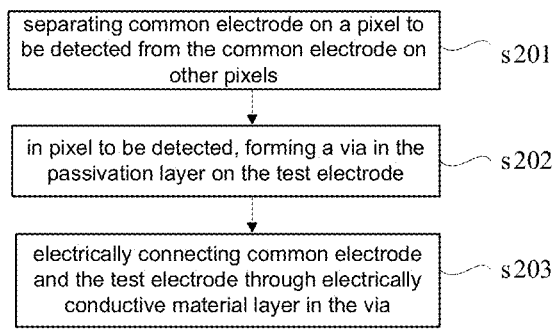
FIG. 3 is a flowchart of a method for testing the array substrate in embodiment 1 of the present invention.

As shown in FIG. 3, this embodiment also provides a test method for testing the channel performance of the thin film transistor on the above-described array substrate, including the following steps:

S201: separating the common electrode on a pixel to be detected from the common electrode on the other pixels. For example, the separation of the common electrodes may be achieved by using a laser cutting device.

S202: in the pixel to be detected, forming a via in the passivation layer on the test electrode.

S203: electrically connecting the common electrode to the test electrode through an electrically conductive material layer in the via.

Preferably, the electrically conductive material layer is the common electrode which has already covered the test electrode with the passivation layer therebetween during manufacturing.

Preferably, a via is formed on the test electrode in the passivation layer by means of laser fusion, and the electrically conductive material layer is melted and flows into the via.

Preferably, the electrically conductive material layer is formed by depositing electrically conductive material using a chemical vapor deposition (CVD) apparatus during testing.

That is, the way in which the common electrode and the test electrode are electrically connected through the electrically conductive material layer has the following types:

The first way: when the common electrode is not disposed right above the test electrode, and a via has already been formed in the passivation layer on the test electrode, the common electrode can be electrically connected to the test electrode through the via by depositing electrically conductive material.

The second way: when the common electrode covers the test electrode with the passivation layer therebetween (i.e., the common electrode is disposed right above the test electrode), a via is formed in the passivation layer on the test electrode by means of laser fusion, and the electrically conductive material layer is melted and flows into the via such that the common electrode and the test electrode are electrically connected through the via.

It can be seen that, the drain electrode and the active layer are electrically connected (inherent characteristics of TFT), the active layer and the test electrode are electrically connected, the test electrode and the common electrode are electrically connected through the electrically conductive material, and therefore, the signal of the drain electrode can be transmitted to the common electrode on the pixel to be detected, which has been separated from the common electrode on the other pixels, of the array substrate surface. In practice, simply connect one probe of a test apparatus to the gate line (of course, this probe may also be connected to a circuit pin of the gate line driving element), connect one probe of the test apparatus to the data line (of course, this probe may also be connected to a circuit pin of the data line driving element), connect one probe of the test apparatus to the common electrode of the pixel to be detected, and input test signals to the gate line and the data line respectively, and the channel performance of the tested thin film transistor of the pixel to be detected is thus obtained. As the size of TFT is relatively small, the size of the drain electrode therein is smaller, but after the signal of the drain electrode is transmitted to the array substrate surface through the common electrode on the pixel to be detected (which has been separated from the common electrode on the other pixels), on one hand, the probe of the test apparatus can directly collect the signal of the drain electrode, and on the other hand, as relative to the size of TFT, the size of the common electrode on the pixel to be detected is much larger, the probe can easily be aligned, and therefore, the probe of the test apparatus can collect the signal of the drain electrode more easily. It can be seen that it is possible to perform TFT channel characteristics test on the array substrate of this embodiment by only using an existing test apparatus.

Figure 4:
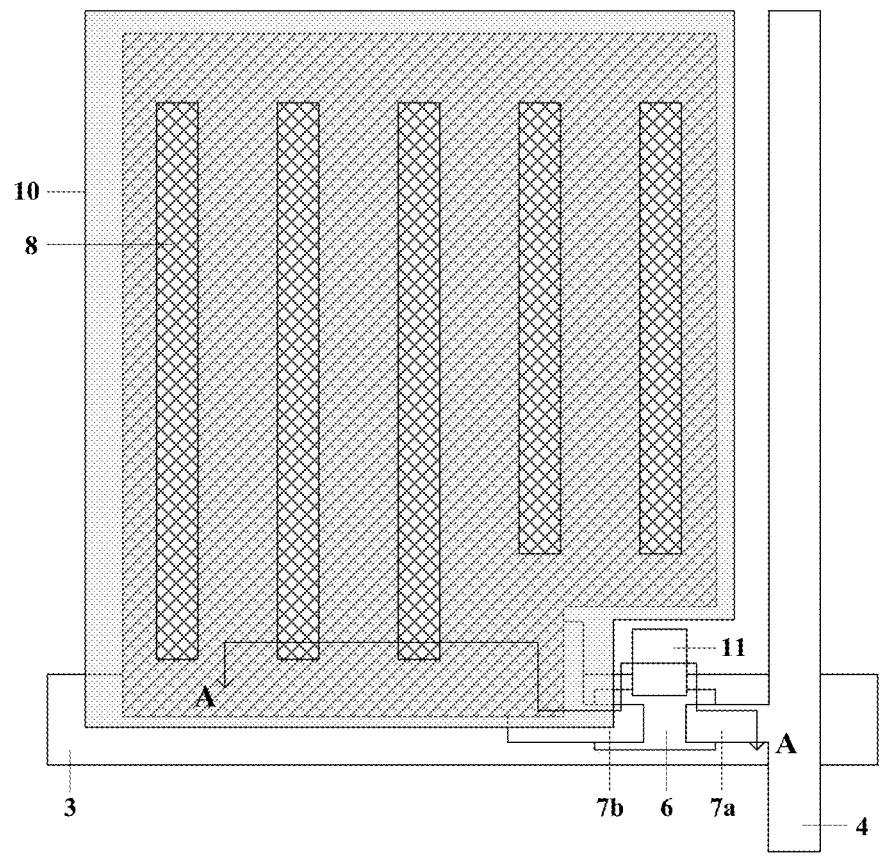
FIG. 4 (a) is a schematic diagram of the planar structure of the array substrate according to embodiment 2 of the present invention, and FIG. 4 (b) is a sectional view taken along a line A-A in FIG. 4 (a)
Figure 4:
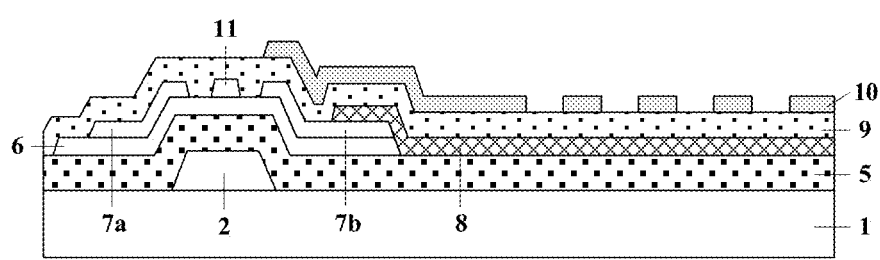

Embodiment 2:

As shown in FIGS. 4 (a) and 4 (b), this embodiment provides an array substrate, including a substrate 1, a thin film transistor, a gate line 3, a data line 4, a gate insulating layer 5, a pixel electrode 8, a passivation layer 9, a common electrode 10 and a test electrode 11. The thin film transistor includes a gate electrode 2, an active layer 6, a source electrode 7a and a drain electrode 7b.

Wherein, the gate electrode 2 and the gate line 3 electrically connected thereto are disposed on the substrate 1; the gate insulating layer 5 covers the gate electrode 2 and extends onto the substrate 1; the active layer (i.e., a semiconductor layer) 6 is disposed on the gate insulating layer 5 on the gate electrode 2; the source electrode 7a, the drain electrode 7b and the test electrode 11 are disposed on the active layer 6, respectively (that is, the source electrode 7a, the drain electrode 7b and the test electrode 11 are electrically connected to the active layer 6, respectively), a channel region (i.e., a TFT channel) is formed between the source electrode 7a and the drain electrode 7b, the test electrode 11 may or may not be disposed at the channel region; the data line 4 and the source electrode 7a are electrically connected; the pixel electrode 8 is electrically connected to the drain electrode 7b and extends onto the gate insulating layer 5; the passivation layer 9 covers the active layer 6, the test electrode 11, the source electrode 7a, the drain electrode 7b and the pixel electrode 8, and extends on the gate insulating layer 5 such that the test electrode 11 is electrically insulated from the source electrode 7a and the drain electrode 7b, and the gate electrode 2 is electrically insulated from the source electrode 7a, the drain electrode 7b and the test electrode 11 through the gate insulating layer 5; the common electrode 10 is disposed above the pixel electrode 8 with the passivation layer 9 therebetween. In this embodiment, the common electrode 10 is not disposed right above the test electrode 11. Preferably, the distance between the test electrode 11 and the source electrode 7a equals to a half of the distance between the source electrode 7a and the drain electrode 7b (i.e., TFT channel width).

This embodiment also provides a display device including the above-described array substrate.

Figure 5:
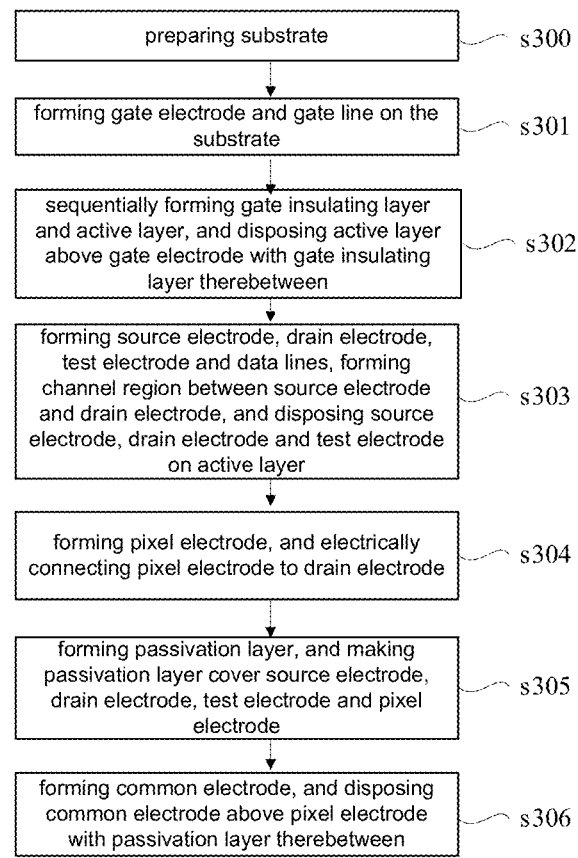
FIG. 5 is a flowchart of a method for fabricating the array substrate in embodiment 2 of the present invention.

As shown in FIG. 5, this embodiment also provides a method for fabricating the above-described array substrate, including the following steps:

S300: preparing a substrate 1.

S301: forming a gate electrode 2 and a gate line 3 on the substrate 1.

Specifically, a gate metal thin film is formed on the substrate 1, then a layer of photoresist is coated thereon, and the photoresist is exposed using a mask plate and is developed, etched and stripped to form the patterns of the gate electrode 2 and the gate line 3.

The gate metal thin film can be formed using magnetron sputtering method, and its thickness range is 1000 Å~7000 Å. The gate metal thin film can be made using a single-layer film of molybdenum, aluminum, aluminum-nickel alloy, molybdenum-tungsten alloy, chromium or copper, or using a multiple-layer film formed by any combination of the above metals/alloys.

S302: sequentially forming a gate insulating layer 5 and an active layer 6 on the substrate subjected to step S301, and disposing the active layer 6 above the gate electrode 2 with the gate insulating layer 5 therebetween.

Specifically, a gate insulating thin film and an amorphous silicon thin film are sequentially formed on the substrate subjected to step S301, then a layer of photoresist is coated thereon, and the photoresist is exposed using a mask plate and is developed, etched and stripped to form the patterns of the gate insulating layer 5 and the active layer 6. The gate insulating layer 5 functions as an etching blocking layer to prevent a damage to the pattern of the gate electrode 2 when forming the pattern of the active layer 6.

The gate insulating thin film and the amorphous silicon thin film can be formed using a chemical vapor deposition method. The thickness range of the gate insulating thin film is 1000 Å~6000 Å, and the gate insulating thin film can be made of silicon nitride, silicon oxide or silicon oxynitride. The thickness range of the amorphous silicon thin film is 1000 Å~6000 Å. Preferably, the amorphous silicon thin film is dry etched to form the pattern of the active layer 6 (that is, forming a silicon island).

S303: forming a source electrode 7a, a drain electrode 7b, a test electrode 11 and data lines 4 on the substrate subjected to step S302, forming a channel region between the source electrode 7a and the drain electrode 7b, and disposing the source electrode 7a, the drain electrode 7b and the test electrode 11 on the active layer 6.

Specifically, a source-drain metal thin film is formed on the substrate subjected to step S302, then a layer of photoresist is coated thereon, and the photoresist is exposed using a mask plate and is developed, etched and stripped to form the patterns of the source electrode 7a, the drain electrode 7b, the test electrode 11 and the data lines 4, and the source electrode 7a and the drain electrode 7b are formed on the two ends of the active layer respectively.

The source electrode 7a, the drain electrode 7b, the test electrode 11 and the data lines 4 have the same slope angel after etching and thickness. The thickness range and the material of the source-drain metal thin film are the same as those of the gate metal thin film.

S304: forming a pixel electrode 8 on the substrate subjected to step S303, and electrically connecting the pixel electrode 8 to the drain electrode 7b.

Specifically, a pixel electrode thin film is formed on the substrate subjected to step S303, then a layer of photoresist is coated thereon, and the photoresist is exposed using a mask plate and is developed, etched and stripped to form the pattern of the pixel electrode 8.

The pixel electrode thin film can be formed using a chemical vapor deposition method, its thickness range is 100 Å~1000 Å, and can be made of Indium Tin Oxide (ITO) or Indium Zinc Oxide (IZO).

S305: forming a passivation layer 9 on the substrate subjected to step S304, and making the passivation layer 9 cover the source electrode 7a, the drain electrode 7b, the test electrode 11 and the pixel electrode 8.

Specifically, a passivation layer thin film is formed on the substrate subjected to step S304, then a layer of photoresist is coated thereon, and the photoresist is exposed using a mask plate and is developed, etched and stripped to form the pattern of the passivation layer 9.

The passivation layer thin film can be formed using a chemical vapor deposition method, its thickness range is 1000 Å~6000 Å, and can be made of silicon nitride or silicon dioxide.

S306: forming a common electrode 10 on the substrate subjected to step S305, and disposing the common electrode 10 above the pixel electrode 8 with the passivation layer 9 therebetween.

Specifically, a common electrode thin film is formed on the substrate subjected to step S305, then a layer of photoresist is coated thereon, and the photoresist is exposed using a mask plate and is developed, etched and stripped to form the pattern of the common electrode 10. The thickness range and the material of the common electrode thin film are the same as those of the pixel electrode thin film, respectively.

It can be seen that, compared to an existing manufacturing method, the method for fabricating the array substrate of the present embodiment does not increase cost or the number of processes, and does not change the materials of the multiple-layer structure of the array substrate.

The test method for testing the channel performance of the thin film transistor on the array substrate of this embodiment is the same as that in Embodiment 1, and the way in which the common electrode and the test electrode are electrically connected through the electrically conductive material layer may use the first way described in Embodiment 1, which is not repeated here.

The other structures, methods and functions in this embodiment are the same as those in Embodiment 1, and they are not repeated here.

Figure 6:
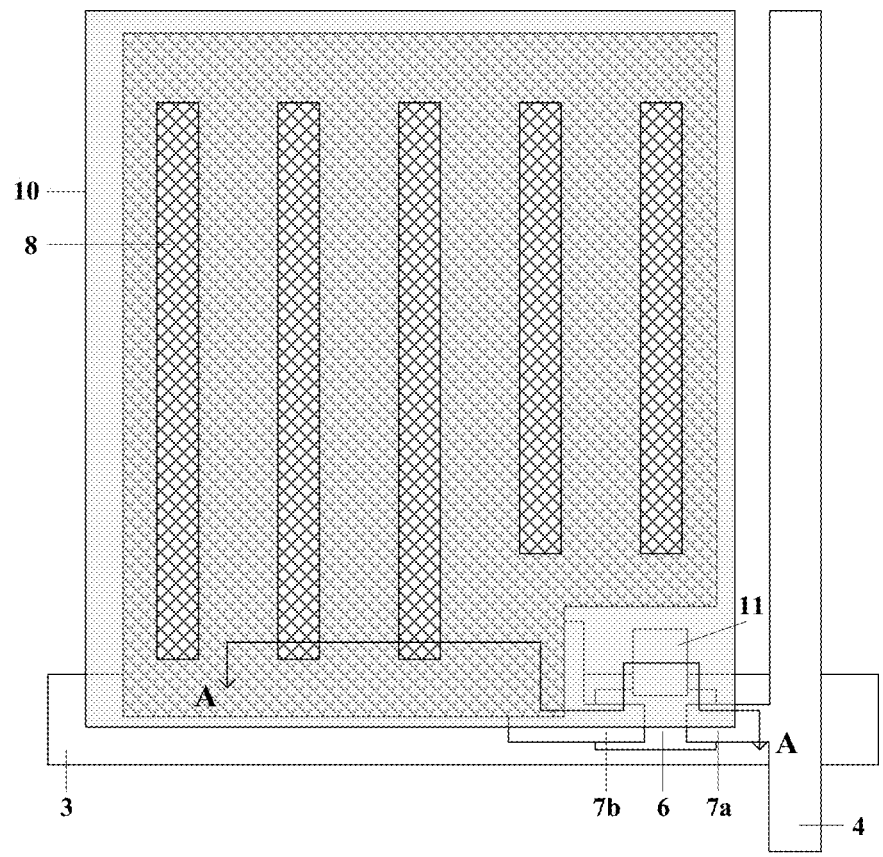
FIG. 6 (a) is a schematic diagram of the planar structure of the array substrate according to embodiment 3 of the present invention, and FIG. 6 (b) is a sectional view taken along a line A-A in FIG. 6 (a)
Figure 6:
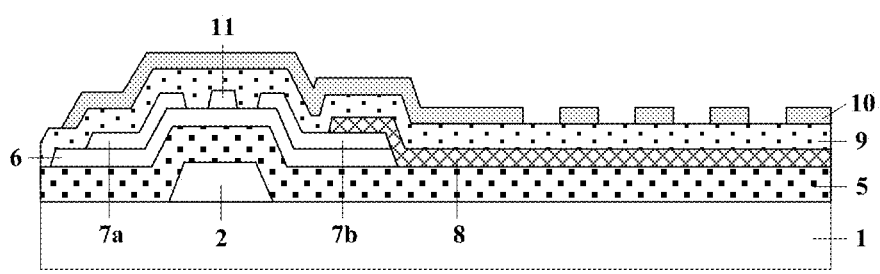

Embodiment 3:

As shown in FIGS. 6 (a) and 6 (b), the difference between the array substrate and the method for fabricating the array substrate of this embodiment and those in Embodiment 2 is that: the common electrode 10 extends above the test electrode 11, that is, the common electrode 10 covers the test electrode 11 with the passivation layer 9 therebetween.

This embodiment also provides a display device including the above-described array substrate.

The test method for testing the channel performance of the thin film transistor on the array substrate of this embodiment is the same as that in Embodiment 1, and the way in which the common electrode and the test electrode are electrically connected through the electrically conductive material layer may use the second way described in Embodiment 1, which is not repeated here.

The other structures, methods and functions in this embodiment are the same as those in Embodiment 2, and they are not repeated here.

Figure 7:
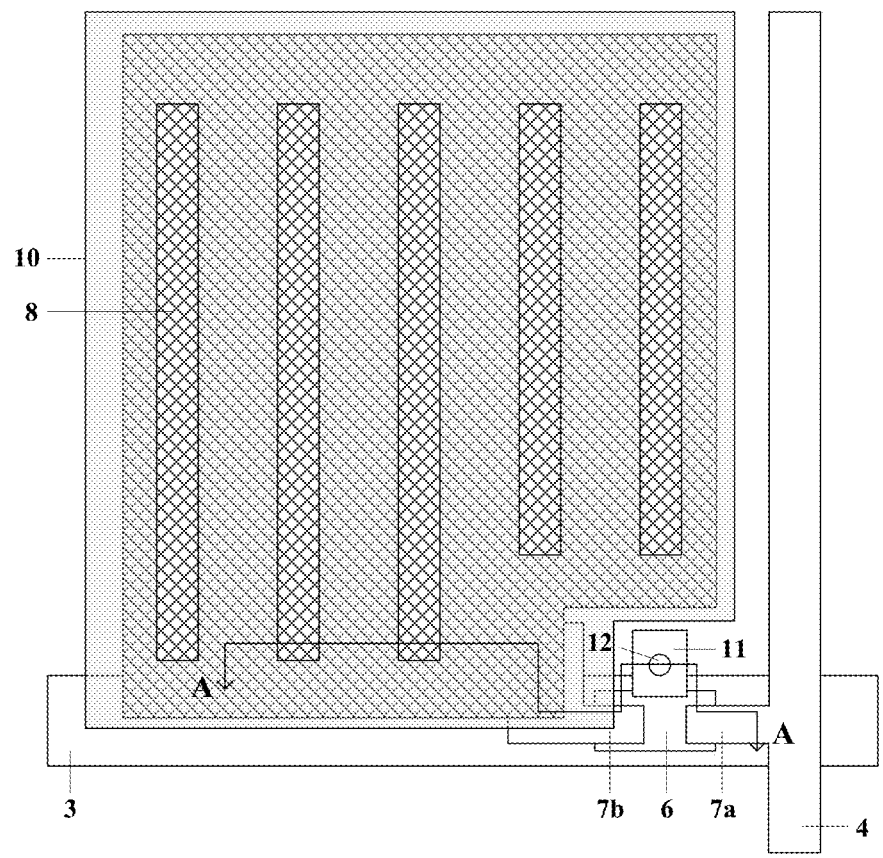
FIG. 7 (a) is a schematic diagram of the planar structure of the array substrate according to embodiment 4 of the present invention, and FIG. 7 (b) is a sectional view taken along a line A-A in FIG. 7 (a)
Figure 7:
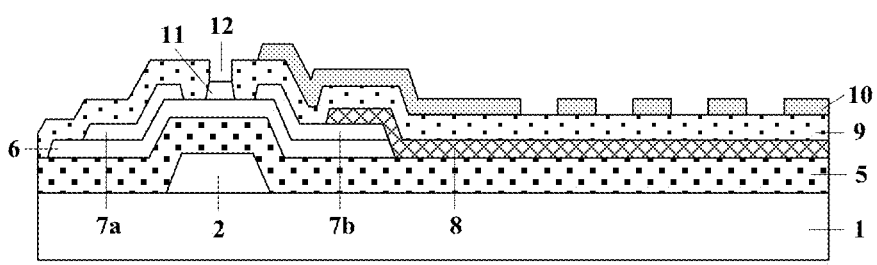

Embodiment 4:

As shown in FIGS. 7(a) and 7 (b), the difference between the array substrate and the method for fabricating the array substrate of this embodiment and those in Embodiment 2 is that: the passivation layer 9 has a via 12 disposed (formed) at the location on the test electrode 11. As the via has been formed in the passivation layer 9 in advance, the array substrate with such structure will no longer need to form a via when the channel performance of the thin film transistor on the array substrate with such structure is tested, which makes the test method more simple and easy.

This embodiment also provides a display device including the above-described array substrate.

The test method for testing the channel performance of the thin film transistor on the array substrate of this embodiment is the same as that in Embodiment 1, and the way in which the common electrode and the test electrode are electrically connected through the electrically conductive material layer may use the first way described in Embodiment 1, which is not repeated here.

The other structures, methods and functions in this embodiment are the same as those in Embodiment 2, and they are not repeated here.

Figure 8:
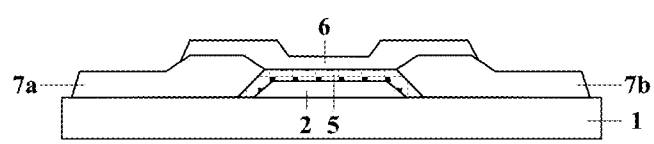
FIG. 8 is a schematic diagram of a structure of a thin film transistor in the array substrate according to embodiment 5 of the present invention.

Embodiment 5:

As shown in FIG. 8, the difference between the array substrate of this embodiment and that in each embodiment described above is that: the structures of the thin film transistors are different.

Specifically, as shown in FIG. 8, the gate insulating layer 5 covers the gate electrode 2; the source electrode 7a and the drain electrode 7b are disposed on the gate insulating layer 5 on the two sides of the gate electrode 2, respectively; the active layer 6 is disposed on the gate insulating layer 5 which is on the gate electrode 2, and is disposed on the source electrode 7a and the drain electrode 7b (that is, the source electrode 7a and the drain electrode 7b are electrically connected to the active layer, respectively, and for facilitating the electric connection between the pixel electrode 8 and the drain electrode 7b, the active layer 6 does not completely cover the drain electrode 7b).

The passivation layer 9 covers the active layer 6, and extends onto the source electrode 7a and the drain electrode 7b which are not completely covered by the active layer 6, and onto the pixel electrode 8; the common electrode 10 may or may not extend above the test electrode 11.

Correspondingly, the differences between the method for fabricating the array substrate of this embodiment and that in each embodiment described above are: forming the source electrode 7a and the drain electrode 7b on the gate insulating layer 5 on the two sides of the gate electrode 2, respectively; forming the active layer 6 on the gate insulating layer 5 which is on the gate electrode 2, and on the source electrode 7a and the drain electrode 7b.

The test method for testing the channel performance of the thin film transistor on the array substrate of this embodiment is the same as that in Embodiment 1, and it is not repeated here.

It should be understood that, the above embodiments are exemplary embodiments merely for illustrating the principles of the present invention, and the present invention is not limited thereto. Various modifications and improvements can be made by a person skilled in the art without departing from the spirit and substance of the present invention, and these modifications and improvements are also deemed as the protection scope of the present invention.

The invention claimed is:

1. An array substrate, including a plurality of pixel units, each pixel unit including a thin film transistor, a pixel electrode, a common electrode and a passivation layer, the thin film transistor including an active layer, a gate electrode, a source electrode and a drain electrode, the drain electrode and the pixel electrode being connected, the passivation layer covering the active layer, the source electrode, the drain electrode and the pixel electrode, the common electrode being disposed above the pixel electrode with the passivation layer therebetween,
wherein a test electrode is disposed on the active layer and under the passivation layer and configured to test channel characteristics of the thin film transistor, and the test electrode is electrically insulated from the gate electrode, the source electrode and the drain electrode.

2. The array substrate according to claim 1, wherein a via is provided at a position on the test electrode in the passivation layer.

3. The array substrate according to claim 1, wherein the array substrate further includes a gate insulating layer; the gate insulating layer covers the gate electrode, and the active layer is disposed on the gate insulating layer above the gate electrode, and the source electrode and the drain electrode are disposed on the active layer, respectively.

4. The array substrate according to claim 1, wherein the array substrate further includes a gate insulating layer; the gate insulating layer covers the gate electrode, the source electrode and the drain electrode are disposed on the gate insulating layer at two sides of the gate electrode, respectively, and the active layer is disposed on the gate insulating layer above the gate electrode and extends onto the source electrode and the drain electrode.

5. The array substrate according to claim 1, wherein the common electrode extends above the test electrode.

6. A method for testing channel characteristics of the thin film transistor on the array substrate according to claim 1, including steps:
separating the common electrode on a pixel to be detected from the common electrode on the other pixels;
in the pixel to be detected, forming a via on the test electrode in the passivation layer; and
electrically connecting the common electrode with the test electrode through an electrically conductive material layer in the via.

7. The method according to claim 6, wherein the electrically conductive material layer is the common electrode which has covered the test electrode with the passivation layer therebetween when fabricating the array substrate.

8. The method according to claim 7, wherein the via is formed on the test electrode in the passivation layer by means of laser fusion, and the electrically conductive material layer is melted and flows into the via.

9. The method according to claim 6, wherein the via is formed on the test electrode in the passivation layer by means of laser fusion, and the electrically conductive material layer is melted and flows into the via.

10. The method according to claim 6, wherein the electrically conductive material layer is formed by depositing electrically conductive material using a chemical vapor deposition apparatus during testing.

11. A display device, including an array substrate, the array substrate, including a plurality of pixel units, each pixel unit including a thin film transistor, a pixel electrode, a common electrode and a passivation layer, the thin film transistor including an active layer, a gate electrode, a source electrode and a drain electrode, the drain electrode and the pixel electrode being connected, the passivation layer covering the active layer, the source electrode, the drain electrode and the pixel electrode, the common electrode being disposed above the pixel electrode with the passivation layer therebetween,
wherein a test electrode is disposed on the active layer and under the passivation layer and configured to test channel characteristics of the thin film transistor, and the test electrode is electrically insulated from the gate electrode, the source electrode and the drain electrode.

* * * * *